(12) United States Patent
Debeurre et al.

(10) Patent No.: US 9,335,396 B2
(45) Date of Patent: May 10, 2016

(54) MCU-BASED COMPENSATION AND CALIBRATION FOR MEMS DEVICES

(71) Applicants: Bruno Debeurre, Phoenix, AZ (US); Tehmoor M. Dar, Mesa, AZ (US); Raimondo P. Sessego, Chandler, AZ (US)

(72) Inventors: Bruno Debeurre, Phoenix, AZ (US); Tehmoor M. Dar, Mesa, AZ (US); Raimondo P. Sessego, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 378 days.

(21) Appl. No.: 13/795,704

(22) Filed: Mar. 12, 2013

(65) Prior Publication Data

US 2014/0266246 A1    Sep. 18, 2014

(51) Int. Cl.
*B81B 7/02* (2006.01)
*G01R 35/00* (2006.01)
*B81C 99/00* (2010.01)

(52) U.S. Cl.
CPC ............ *G01R 35/005* (2013.01); *B81C 99/005* (2013.01)

(58) Field of Classification Search
CPC .................................................... G01R 35/005
USPC ........................................................ 324/601
See application file for complete search history.

(56) References Cited

U.S. PATENT DOCUMENTS

| 4,860,185 A * | 8/1989 | Brewer et al. .................... 363/41 |
| 5,174,884 A * | 12/1992 | Shimada .............. G01D 5/2417 |
| | | 204/406 |
| 6,023,961 A * | 2/2000 | Discenzo et al. ............. 73/54.01 |
| 8,049,569 B1 * | 11/2011 | Wright et al. .................... 331/44 |
| 2008/0178671 A1 * | 7/2008 | Miller et al. .................... 73/488 |
| 2011/0146402 A1 * | 6/2011 | Donadel et al. ............ 73/504.12 |
| 2012/0116707 A1 * | 5/2012 | Malvern ........................ 702/104 |
| 2014/0230551 A1 * | 8/2014 | Kunimi et al. .............. 73/514.32 |

(Continued)

FOREIGN PATENT DOCUMENTS

WO    WO 2013047787 A1 *  4/2013

OTHER PUBLICATIONS

L.A. Rocha, et al., "Auto-Calibration of Capacitive MEMS Accelerometers Based on Pull-In Voltage", Microsyst Technol, Feb. 18, 2011, pp. 429-436, published online.

(Continued)

*Primary Examiner* — Son Le
(74) *Attorney, Agent, or Firm* — Schmeiser, Olsen & Watts LLP

(57) ABSTRACT

A sensor system includes a microelectromechanical systems (MEMS) sensor, a processor, measurement circuitry, stimulus circuitry and memory. The MEMS sensor is configured to provide an output responsive to physical displacement within the MEMS sensor to the measurement circuitry. The stimulus circuitry is configured to provide a stimulus signal to the MEMS sensor to cause a physical displacement within the MEMS sensor. The measurement circuitry is configured to process the output from the MEMS sensor and provide it to the processor. The processor is configured to generate stimulus signals and provide them to the stimulus circuitry for provision to the MEMS sensor. The processor is configured to monitor the output from the measurement circuitry corresponding to the physical displacement occurring in the MEMS sensor, calculate MEMS sensor characteristics based on the output, and update calibration values based on the output. Methods for monitoring and calibrating MEMS sensors are also provided.

20 Claims, 3 Drawing Sheets

(56) References Cited

U.S. PATENT DOCUMENTS

2014/0250970 A1* 9/2014 Fang et al. .................. 73/1.37
2014/0250971 A1* 9/2014 Fang et al. .................. 73/1.37

OTHER PUBLICATIONS

A. Dhani, et al., "Pseudorandom Functional Bist for Linear and Nonlinear MEMS", TIMA Laboratory, 2006, pp. 664-669, Grenoble, France.

* cited by examiner

MCU-BASED COMPENSATION AND CALIBRATION FOR MEMS DEVICES

TECHNICAL FIELD OF THE INVENTION

The present invention relates generally to microelectromechanical systems (MEMS) devices utilized in electronic systems. More specifically, the present invention relates to electronically testing, measuring and calibrating MEMS devices while those devices are present in electronic systems.

BACKGROUND OF THE INVENTION

Microelectromechanical Systems (MEMS) sensors are widely used in applications such as automotive, inertial guidance systems, household appliances, protection systems for a variety of devices, and many other industrial, scientific, and engineering systems. Such MEMS sensors are used to sense a physical condition such as acceleration, pressure, angular rotation, or temperature, and to provide an electrical signal representative of the sensed physical condition to the applications and/or systems employing the MEMS sensors.

BRIEF DESCRIPTION OF THE DRAWINGS

A more complete understanding of the present invention may be derived by referring to the detailed description and claims when considered in connection with the Figures (not necessarily drawn to scale), wherein like reference numbers refer to similar items throughout the Figures, and:

DETAILED DESCRIPTION

Figure 1:
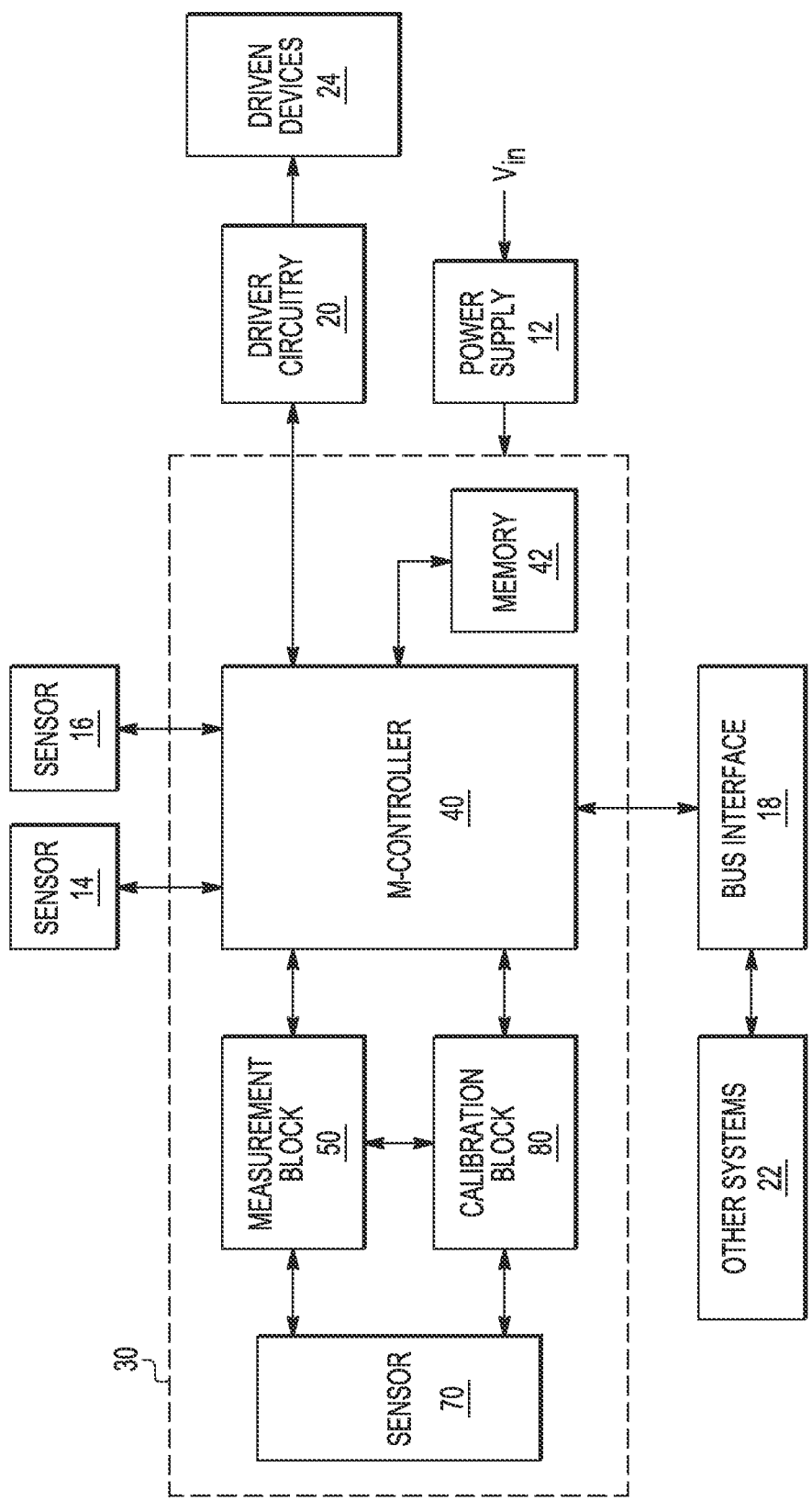
FIG. 1 shows a block diagram of a sensor-responsive system configured in accordance with the teaching of an embodiment.

Capacitive-sensing MEMS designs are highly desirable for operation in acceleration, angular rotation, pressure environments and in miniaturized devices due to their relatively low cost. When subjected to acceleration, angular rotation, pressure, or some other external stimulus to which the MEMS device is designed to be responsive, capacitive sensing MEMS devices provide a change in electrical capacitance that corresponds to the magnitude of the applied stimulus. In other words, the electrical output at a given time of a MEMS device corresponds to the magnitude of the stimulus applied to that MEMS device at that given time. In this manner, by monitoring the electrical output of a MEMS device, a system may determine the magnitude of external stimuli applies to various MEMS devices (pressure, acceleration, etc.), and use that information to help determine what actions the system should take responsive to the stimuli. For example, an automotive air bag system sensing a rapid deceleration of the automobile based on the electrical output of a MEMS accelerometer device may determine that it is necessary to deploy an airbag in order to protect a vehicle occupant. One common form of MEMS device is an accelerometer in the form of a two layer capacitive transducer having a "teeter-totter" or "see saw" configuration. This commonly utilized transducer type uses a movable element or plate that rotates under z-axis acceleration above a substrate. The accelerometer structure can measure two distinct capacitances to determine differential or relative capacitance, and provide that information as an output to the MEMS accelerometer. Other MEMS devices designed to sense other applied stimuli may take on various forms, provided that the output of the MEMS device is configured to correspond to the magnitude of the stimulus being monitored.

The electro-mechanical characteristics of each MEMS device may differ due to a variety of factors (manufacturing tolerances, slight differences in processing depending on where and when the MEMS device was manufactured, etc.). This means that the electrical output of one MEMS device responsive to a certain magnitude of stimulus might be different from the electrical output of a second MEMS device responsive to a stimulus of the very same magnitude. Because systems employing MEMS devices may use the electrical output to calculate the extent of the stimulus, and may use the result of that calculation to determine whether or not to take a certain action (such as, for example, deploying an airbag), it is important that MEMS devices be calibrated such that a system can correlate a given electrical output from the MEMS sensor to a specific amount of applied stimulus. Typically this calibration occurs prior to shipment of the system employing the MEMS sensor, and is accomplished by applying the actual physical stimulus (for example, acceleration) to the system, measuring the electrical response of the MEMS sensor, and storing values in the system representative of any "correction" factors that need to be applied to the electrical output of the MEMS sensor to make sure that the "corrected" MEMS sensor output corresponds to the magnitude of the applied stimulus.

Although physically applying various stimuli to systems employing MEMS sensors can serve to provide calibration data such that the system can function properly, such physical testing can be expensive, time-consuming and damaging to the system being tested. Furthermore, the need to physically test a variety of systems and applications employing MEMS sensors can require numerous, application-specific test stations to be designed and built for each application to be tested, increasing the cost and time associated with such testing. In addition, although physical testing prior to shipment of systems employing MEMS sensors can provide calibration data that may be accurate at the time of testing, such testing ignores the fact that over time (and as a result of use and/or damage), the electro-mechanical characteristics of the MEMS device may change, making the initial calibration values no longer appropriate, and possibly causing system malfunction. Finally, in the event of a system malfunction, attempts to determine the cause of the malfunction can be complicated by requiring that the system employing the MEMS device be physically removed from the end application (such as, for example, an automobile) so that the MEMS device can again be physically tested and possibly recalibrated. Such a requirement can make maintenance and repair of systems employing MEMS devices cost-prohibitive.

In one aspect, a system and method are provided for the electrical testing of MEMS devices without a need for applying physical forces external to the MEMS device. In an additional aspect, a system and method are provided for testing, monitoring and recalibrating MEMS devices throughout the lifetime of those MEMS devices and while those devices remain located and functioning in systems employing the MEMS devices. Thus, systems and methods achieving design objectives of low-cost MEMS sensor testing, repeated testing of MEMS sensors throughout the life of the MEMS sensors, testing of MEMS sensors without removal of the sensors from the application, and re-calibration of MEMS devices during the life of the MEMS devices are provided.

FIG. 1 shows a block diagram of a sensor-responsive system 10 configured in accordance with an embodiment. Sensor-responsive system 10 includes a sensor system 30 configured to monitor, communicate with, calibrate, and control at least one MEMS sensor 70. In an embodiment, MEMS sensor 70 is a MEMS sensor configured to respond to a stimulus by providing an output signal corresponding to the stimulus. Sensor system 30 is also configured to provide sensor-related information from MEMS sensor 70 to other elements of sensor-responsive system 10. Sensor system 30 is further configured to process sensor-related information from MEMS sensor 70, perform calculations and make decisions based on the sensor-related information, communicate the results of the calculations and decisions to other components of sensor-responsive system 10, and to cause other components of sensor-responsive system 10 to perform actions based on the results of the calculations and decisions. A more specific discussion of sensor system 30 will be discussed below with respect to FIG. 2.

Continuing with FIG. 1, sensor-responsive system 10 includes a bus interface 18 coupled to sensor system 30 and to other systems 22. Bus interface 18 is configured to communicate data and commands between sensor system 30 and various other systems 22 that may also be connected to bus interface 18. In an embodiment in which sensor-responsive system 10 is located in an automobile, bus interface 18 may be any number of automotive-related busses such as CAN or J-1850. In other embodiments, bus interface 18 may be any other bus configured to allow the communication of data and/or commands among devices electrically coupled to bus interface 18. Other systems 22 may be systems configured to provide input data to sensor system 30 or receive output from sensor system 30. In an embodiment in which sensor-responsive system 10 is located in an automobile, other systems 22 may include engine control modules, body electronics control modules, transmission control modules, or any other vehicle electronics module. In other embodiments in which sensor-responsive system 10 is being used in conjunction with inertial guidance systems, household appliances, protection systems for a variety of devices, portable computing and telecommunication devices, handheld game controllers, and other industrial, scientific, and engineering systems, other systems 22 may include modules and/or components of those systems.

Sensor-responsive system 10 is also shown including sensor 14 and sensor 16. In an embodiment, sensor 14 is an occupant sensor configured to determine if an occupant is present in an automobile, and to provide a signal indicative of an occupant being present to sensor system 30. In an embodiment, sensor 16 is a rollover sensor configured to determine if an automobile in which it is located has rolled over, and to provide a signal indicative of a rollover condition to sensor system 30.

Sensor-responsive system 10 is further shown having driver circuitry 20 electrically coupled to sensor system 30 and driven devices 24. Driver circuitry 20 is configured to provide a signal, responsive to a signal from sensor system 30, to driven devices 24 to cause driven devices 24 to take some action. In an embodiment in which sensor-responsive system 10 is an airbag system located in an automobile, driven devices 24 are squibs coupled to airbags, and driver circuitry 20 is configured to provide an electronic signal to the driven devices 24 (squibs), responsive to an electronic signal provided by sensor system 30, to cause the squibs to deploy airbags in the vehicle.

Sensor-responsive system 10 is further shown having a power supply 12. Power supply 12 is electronically coupled to sensor system 30 and other components of sensor-responsive system 10, and is configured to provide sensor system 30 and other components of sensor-responsive system 10 with various voltages and currents to permit the sensor-responsive system 10 and its components to operate. It should be appreciated that power supply 12 may be configured to supply any number of voltages and currents, from low voltages required to supply digital signal levels, to high voltage levels to drive various power and electro-mechanical devices.

Figure 2:
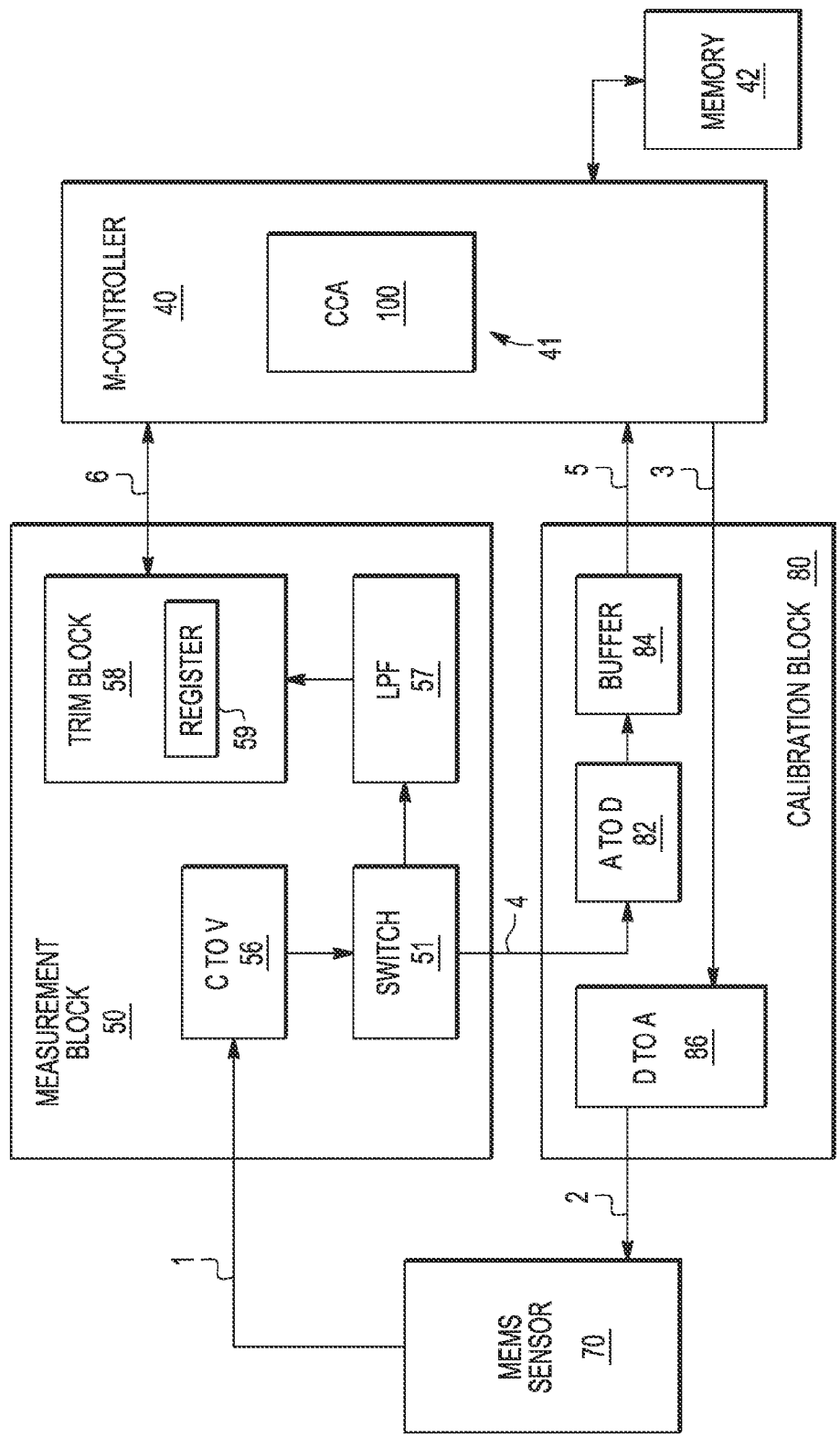
FIG. 2 shows a block diagram of a sensor system of the sensor-responsive system of FIG. 1 configured in accordance with the teaching of an embodiment.

FIG. 2 shows a block diagram of a sensor system 30 of the sensor-responsive system of FIG. 1 configured in accordance with an embodiment. Sensor system 30 includes a MEMS sensor 70. MEMS sensor 70 is an electromechanical sensor configured with at least one moveable mechanical portion. The moveable mechanical portion has a pre-determined range of travel, and an electrical signal 1 provided external to MEMS sensor 70 varies according to the movement of the moveable mechanical portion within the range of travel. In an embodiment, MEMS sensor 70 is configured such that, when the moveable mechanical portion of MEMS sensor 70 moves, it continuously provides capacitance values at an output of MEMS sensor 70 that correspond to the magnitude of the motion of the moveable mechanical portion.

In addition, MEMS sensor 70 is configured to receive at least one input signal 2, such that when the input signal 2 is provided to the input of MEMS sensor 70, the moveable mechanical portion of MEMS sensor 70 moves, responsive to the input signal 2, an amount corresponding to the magnitude of the input signal 2. In an embodiment, MEMS sensor 70 is configured such that when an analog voltage is applied to an input of MEMS sensor 70, the moveable mechanical portion of MEMS sensor 70 moves an amount that corresponds to the magnitude of the analog voltage, and continues to move corresponding to any voltage changes in the input signal 2. In an embodiment, MEMS sensor 70 is configured such that when the moveable mechanical portion of MEMS sensor 70 moves, an analog voltage corresponding to movements of the moveable mechanical portion may be provided at an output of MEMS sensor 70. In an alternative embodiment, MEMS sensor 70 is configured such that when the moveable mechanical portion of MEMS sensor 70 moves a signal other than voltage or capacitance corresponding to the movements of the moveable mechanical portion may be provided at an output of MEMS sensor 70. In an embodiment, MEMS sensor 70 is a MEMS accelerometer, providing an output signal 1 corresponding to movement of the moveable mechanical portion in response to acceleration or deceleration of MEMS sensor 70, or a device in which MEMS sensor 70 is present.

In alternative embodiments, MEMS sensor 70 may be any MEMS sensor configured as, for example, an inertial sensor, gyroscope, pressure sensor, or any other MEMS device configured to provide an output signal in response to a physical stimulus. It should be appreciated that each MEMS device may have a number of characteristics unique to each individual MEMS device, such as, for example, a resonant frequency, damping characteristics, displacement characteristics, spring constant characteristics, thickness, space between beams, and other response characteristics. It should also be appreciated that these unique characteristics may change over time, and/or in response to physical forces applied to the MEMS device or environmental conditions such as temperature. MEMS sensor 70 may be formed using existing and upcoming MEMS fabrication design rules and processes that include, for example, deposition, patterning, and etching.

Sensor system 30 further includes a measurement block 50 electrically coupled to MEMS sensor 70. Measurement block 50 is configured to receive an electronic signal 1 from MEMS sensor 70, process the signal 1 to convert it to a form useable by devices external to measurement block 50, filter the signal 1, and provide the processed, and in some cases filtered, signal 1 to devices coupled to measurement block 50, such as, for example, microcontroller 40 and calibration block 80 (discussed infra). In an embodiment generally illustrated in FIG. 2, sensor system 30 includes capacitance-to-voltage (C-to-V) circuitry referred to herein as C-to-V 56. C-to-V 56 is configured to receive an input capacitance from MEMS sensor 70 and convert it to a voltage output.

The voltage output of C-to-V 56 is shown coupled to a switch 51. Switch 51 is configured to switch between providing the output voltage of C-to-V 56 to a calibration block 80 (described infra), and providing the output voltage of C-to-V 56 to a low pass filter 57. Low pass filter 57 is shown electrically coupled to a trim block 58. Low pass filter 57 is configured to low-pass filter the output voltage received from C-to-V 56 via switch 51 to remove noise, and provide the filtered output voltage to trim block 58. Trim block 58 is shown including registers 59. Registers 59 are configured to store calibration values (also referred to as trim values) used in monitoring, evaluating, calibrating, and operating MEMS sensor 70. Trim block 58 is also shown electrically coupled to microcontroller 40 (discussed infra). In an embodiment, calibration/trim values are constants that are used in calculations performed by microcontroller 40 to more directly correlate the output of MEMS sensor 70 with the actual physical motion of the moveable mechanical portions of the MEMS sensor 70. Trim block 58 is configured to provide the filtered output voltage provided by C-to-V 56 to microcontroller 40 as a signal 6, to receive and store trim values calculated by microcontroller 40 in registers 59, and to provide those stored trim values to microcontroller 40 for use in various algorithms running in microcontroller 40.

In an alternative embodiment, LPF 57 may be bypassed, and an unfiltered output voltage provided to microcontroller 40 for use by microcontroller 40 in estimating trim values/coefficients. In an embodiment, trim values, such as offset and gain trim values of MEMS sensor 70, are analog, and registers 59 are configured to store the analog trim values. In an embodiment, initial trim values, comprising electrical characteristics of trim block 58 such as oscillator trim, regulator voltage trim, reference current trim, capacitance characteristics of trim block 58, and other electrical characteristics of trim block 58, are determined and stored in registers 59 based on factory testing and calculations prior to sensor system 30 being placed into service in an application. These initial trim values may be used by microcontroller 40 in various algorithms unless and until the trim values are updated. It should be appreciated that the initial trim values for trim block 58 may be based on manufacturing process data, calculations or estimates provided by engineering teams based on process and other data, or other testing done at the factory during manufacturing of sensor system 30.

In an embodiment, measurement block 50 receives a low-level capacitance signal from MEMS sensor 70, converts the signal to a voltage signal using capacitance-to-voltage (C-to-V) circuitry 56 of measurement block 50, provides the voltage signal to calibration block 80 as a signal 4, filters the voltage signal using low-pass filter circuitry of MEMS sensor 70, and provides the filtered voltage signal to microcontroller 40 as a signal 5. In an embodiment, measurement block 50 further provides switch 51 to switch between providing the voltage signal 4 to calibration block 80 on the one hand, and providing the voltage signal 4 to the low pass filter (and subsequently to microcontroller 40). As noted above, the electronic signal provided to measurement block 50 by MEMS sensor 70 will have characteristics corresponding to the movement of the moveable mechanical portion of MEMS sensor 70. In addition, the resulting voltage signal provided by measurement block 50 will also have characteristics corresponding to the movement of the moveable mechanical portion of MEMS sensor 70. In effect, the resulting voltage signal 4 provides a picture of how the moveable mechanical portion of MEMS sensor 70 is moving.

Sensor system 30 also includes a calibration block 80 electrically coupled to measurement block 50, MEMS sensor 70, and microcontroller 40. Calibration block 80 is shown having analog-to-digital (A-to-D) conversion circuitry A-to-D 82. A-to-D 82 is configured to receive a voltage signal 4 from C-to-V 56 of measurement block 50, convert the received analog voltage signal to a digital signal representative of the analog voltage signal, and provide the digital voltage signal as a digital voltage signal output from A-to-D 82. A-to-D 82 is shown electrically coupled to a buffer 84. Buffer 84 is configured to store the digital voltage signal provided by A-to-D 82, and to provide the digital voltage signal to microcontroller 40 as signal 5 such that microcontroller 40 may use the signal 5 to monitor the operation of MEMS sensor 70 and perform various algorithms utilizing the digital voltage signal. Calibration block 80 is also shown being configured to provide electrostatic stimulus to MEMS sensor 70. More specifically, in an embodiment, calibration block 80 is shown having digital-to-analog (D-to-A) conversion circuitry D-to-A 86. D-to-A 86 is configured to receive a digital signal 3 from microcontroller 40, convert the received digital signal 3 to an analog signal representative of the received digital signal, and provide the analog signal as an output signal 2 from D-to-A 86. As shown, calibration block 80 is electrically coupled to MEMS sensor 70, and is configured to provide the analog output signal 2 of D-to-A 86 as an input to MEMS sensor 70.

Sensor system 30 also includes a microcontroller 40 electrically coupled to various other components of sensor system 30 and sensor-responsive system 10. In an alternative embodiment, microcontroller may be any type of processor. Microcontroller 40 includes logic, volatile and non-volatile memory 41, registers, input/output circuitry and code configured to cause microcontroller 40 to perform various functions for sensor system 30 and sensor-responsive system 10. As shown in FIG. 2, microcontroller 40 is electrically coupled to measurement block 50, calibration block 80, and memory 42. Microcontroller 40 includes a Calibration and Compensation Algorithm 100 stored in memory 41. Microcontroller 40 is configured, responsive to Calibration and Compensation Algorithm 100, to monitor the operation of MEMS sensor 70, provide input signals, including signal 3, to calibration block 80 to cause calibration block 80 to initiate motion of the mechanical portion of MEMS sensor 70 responsive to the signals, and monitor the output signal of MEMS sensor 70 via measurement block 50. Microcontroller 40 is further configured to evaluate the motion of MEMS sensor 70 responsive to the signals 3, perform calculations using the input and output signals and sensor parameters, determine, based on the calculations, if the MEMS sensor 70 is operating properly and/or if adjustments need to be made in trim values stored in measurement block 50, and provide updated trim values to measurement block 50.

Sensor system 30 also includes memory 42 electrically coupled to microcontroller 40. In an embodiment, memory 42 is non-volatile random access memory (NVRAM) configured to hold values to be used by sensor system 30 in performing calculations related to the calibration and/or measurement of MEMS sensor 70. In an embodiment, values related to MEMS sensor 70, referred to as sensor parameters, are predetermined at the time of manufacture of sensor system 30, and are stored in memory 42 when sensor system 30 is manufactured. In alternative embodiments, memory 42 may be other types of memory, such as volatile memory, read only memory (ROM), or any other type of memory generally known in the art.

Referring to FIGS. 1 and 2, the operation of sensor-responsive system 10, according to an embodiment of the invention in which the operation of MEMS sensor 70 is being evaluated and calibration is being performed (if necessary), is generally described. Responsive to Calibration and Compensation Algorithm 100, microcontroller 40 causes a digital signal pattern 3 to be provided to D-to-A 86 of calibration block 80. In an embodiment, the digital signal is a pseudo-random signal. In alternative embodiments, the digital signal may be a square wave, a two-tone pattern, multi-tone signal or other signal pattern. D-to-A 86 converts the digital signal into an analog signal, and provides it as an analog input signal 2 to an input of MEMS sensor 70. The analog input signal 2 creates an electromagnetic force that pulls the moveable mechanical portion (for example, a metallic plate) up and/or down, thereby causing the moveable mechanical portion of MEMS sensor 70 to move responsive to the analog signal. In an embodiment, the analog input signal 2 is applied to fixed capacitance plates of the MEMS sensor 70 located near a moveable mechanical portion, causing the moveable mechanical portion to move. The movement of the moveable mechanical portion of MEMS sensor 70 causes a capacitance value provided at an output of MEMS sensor 70 to vary in a manner that corresponds to the magnitude of the movement of the moveable mechanical portion of MEMS sensor 70. C-to-V 56 of measurement block 50 receives the signal 1 indicative of the varying capacitance value and converts the capacitance values into voltage values. Responsive to Calibration and Compensation Algorithm 100, microcontroller 40 causes switch 51 to switch to a position such that the voltage values provided by C-to-V 56 are provided as an input signal 4 to A-to-D 82 of calibration block 80. A-to-D 82 of calibration block 80 converts the voltage values into digital values, and provides the resulting digital values to microcontroller 40 as signal 5.

Responsive to Calibration and Compensation Algorithm 100, microcontroller 40 evaluates the digital values received from C-to-V 56 via A-to-D 82, evaluates the input signal values initially provided by microcontroller 40, and determines, based on calculations, various parameters of MEMS sensor 70. In an embodiment, microcontroller 40 may use the digital values received to determine various characteristics of MEMS sensor 70, such as, for example, frequency response, damping, spring constant, thickness of MEMS sensor 70, space between beams and/or capacitors on MEMS sensor 70, and other characteristics. In an alternative embodiment, Calibration and Compensation Algorithm 100 in microcontroller 40 first evaluates the input signal values received from calibration block 80 to calculate and/or estimate various parameters such as, for example, the etching bias thickness of the silicon of MEMS sensor 70, side slope of the MEMS sensor 70, critical dimension (CD) of MEMS sensor 70, and fringe of MEMS sensor 70. Calibration and Compensation Algorithm 100 then uses these parameters to calculate estimates of the mass, spring constant, and other properties of the MEMS sensor 70. Finally, Calibration and Compensation Algorithm 100 uses these properties to calculate updated trim values for the MEMS sensor 70, if necessary, which are stored in registers 59 of trim block 58.

In an embodiment, in determining the nature and magnitude of stimulus applied to a MEMS sensor 70, Calibration and Compensation Algorithm 100 utilizes the fact that a MEMS sensor 70, when subjected to a stimulus (such as, for example, acceleration), provides an output signal (such as, for example, a capacitance value) that corresponds both to the motion of a moveable mechanical portion of the MEMS sensor 70, and to the corresponding stimulus (such as, for example, acceleration) to which the MEMS sensor 70 is subjected to cause the motion. Calibration and Compensation Algorithm 100 determines characteristics of the applied stimulus (for example, acceleration) by processing the output signal in conjunction with "trim" or "calibration" values that correspond to various electromechanical characteristics of the MEMS sensor 70 and how that MEMS sensor 70 responds to various a stimulus. These characteristics (trim values) may effect how the MEMS sensor 70 responds to various stimuli (such as, for example, acceleration), and may include, the mass and/or inertia of a moveable portion of the MEMS sensor 70, or other electromechanical characteristics of the MEMS sensor 70.

In determining whether or not to update trim values or take other action, Calibration and Compensation Algorithm 100 may use original trim values for MEMS sensor 70 provided at or near the time of manufacture of MEMS sensor 70. Trim values are based on electromechanical properties of specific MEMS sensor 70, which may vary from device to device, and some of which may change from their original values over time and in certain conditions. For example, the mass and/or inertia of a moveable portion of a MEMS sensor 70 may vary from sensor to sensor due to manufacturing process variations, may change over time with use of the MEMS sensor 70, and may impact the relationship between the MEMS sensor 70 output signal and the physical motion of the moveable portion of the MEMS sensor 70 in response to a stimulus. When a specific MEMS sensor 70 is manufactured, original trim values may be calculated for the device that correspond to the mass of the movable portion of that specific sensor and other electromechanical characteristics of the device. These original values may be stored, for example, in registers 59 of trim block 58. However, as noted above, these trim values may become inaccurate over time due to changes in the electromechanical characteristics of the MEMS sensor 70.

By applying a known stimulus signal to the MEMS sensor 70, the moveable mechanical portion of MEMS sensor 70 may be caused to move in a predictable pattern. Calibration and Compensation Algorithm 100 may then evaluate the output signal of the MEMS sensor 70 (which correlates to how the moveable mechanical portion of MEMS sensor 70 has moved), to determine the mass and/or other electromechanical properties of the MEMS sensor 70, and to calculate trim values corresponding to those electromechanical properties. For example, the mass of the moveable portion of the MEMS sensor 70 may be determined by a specific algorithm using the characteristics of the known stimulus signal and the output signal of the MEMS sensor 70. In an embodiment, this algorithm for a MEMS sensor 70 may be defined from an electrical-mechanical physical model and/or statistical model established and verified by a representative data set of measurements of various MEMS sensor devices.

Calibration and Compensation Algorithm 100 may compare the calculated physical properties, electromechanical properties, and/or trim values to the original properties and/or values or previous properties and/or values. If the properties and/or values are found to have changed, or are inaccurate, new values may be used to replace the original/old values in order to keep the MEMS sensor 70 properly calibrated and/or trimmed. By using updated trim values, an accurate determination of the characteristics of various stimuli applied to the MEMS sensor 70 may continue to be made in spite of changes to the physical and/or electromechanical characteristics of the device over time. Examples of other MEMS sensor electromechanical characteristics for which trim values may be provided include the gaps between capacitance plates of the MEMS sensor, the stiffness of springs in the moveable portion, and any other electromechanical characteristic of the MEMS sensor.

In summary, Calibration and Compensation Algorithm 100 is able to calculate updated trim values for the MEMS sensor 70 by evaluating how the digital values received from C-to-V 56 (and indicative of the response of MEMS sensor 70 to the input stimulus signal) deviate from the expected response of MEMS sensor 70 to the input signal. If microcontroller 40, responsive to Calibration and Compensation Algorithm 100 and various characteristics of MEMS sensor 70, determines that trim values associated with MEMS sensor 70 need to be changed, microcontroller 40 causes updated trim values to be written to registers 59 of trim block 58 of measurement block 50.

Continuing to refer to FIGS. 1 and 2, the operation of sensor-responsive system 10, according to an embodiment of the invention in which calibration is not being performed, is generally described. Microcontroller 40 provides a signal to switch 51, responsive to an algorithm running in microcontroller 40, to switch to a position in which C-to-V 56 provides its output voltage signal 4 to a low pass filter 57. It should be appreciated that when calibration is not being performed, the movable mechanical portions of MEMS sensor 70 will be moving responsive to physical forces (stimulus) to which the sensor system 30 is being subjected. In this case, the capacitive output of MEMS sensor 70 will correspond to the motion of the moveable mechanical portions of MEMS sensor 70 responsive to the physical stimulus. C-to-V 56 of measurement block 50 receives this capacitive output of MEMS sensor 70, converts it to a voltage, and provides the voltage signal 4 to low pass filter 57. Low pass filter 57 low-pass filters the voltage signal to remove noise, and provides the filtered voltage to trim block 58. Trim block 58 in turn adjusts the voltage signal based on trim values stored in register 59 or trim block 58, and provides the filtered voltage to microcontroller 40 as signal 6. Responsive to an application algorithm running in microcontroller 40, microcontroller 40 evaluates the adjusted, filtered voltage signal, and determines, based on the adjusted, filtered voltage signal, how much the moveable mechanical portion of MEMS sensor 70 has moved. If the moveable mechanical portion of MEMS sensor 70 has moved beyond a predetermined amount, or has moved in a predetermined pattern, microcontroller 40 is configured to cause some action to be taken.

Figure 3:
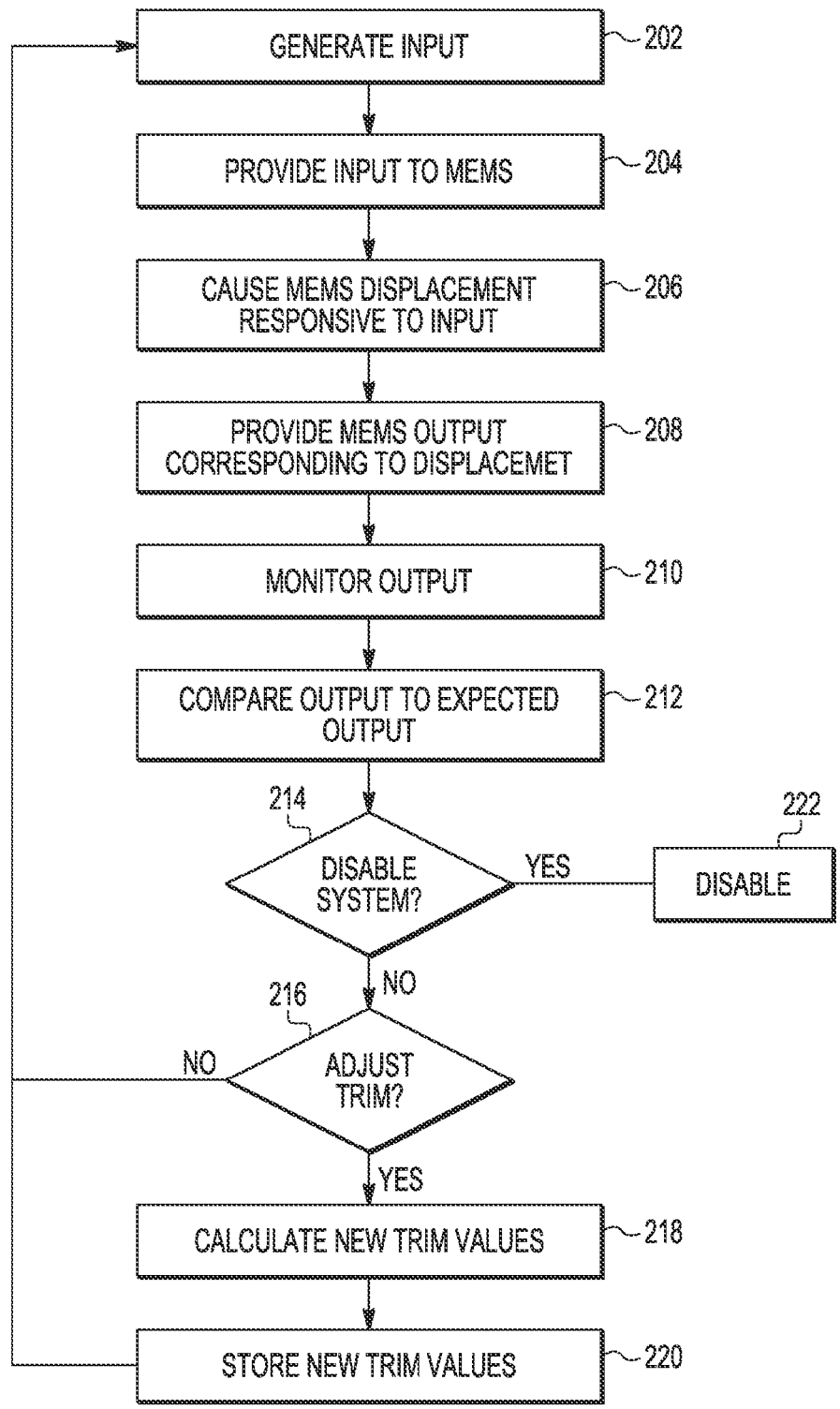
FIG. 3 shows a flow chart of a sensor monitoring and calibration method, according to an embodiment.

FIG. 3 shows a flow chart of a sensor monitoring and calibration method 200, according to an embodiment. In an embodiment, the method 200 is implemented by the execution of Calibration and Compensation Algorithm 100. In a first operation 202, an input signal 3 is generated by a microcontroller 40 (FIG. 1). The signal may be a single value, such as a single voltage level, or it may be a signal pattern including multiple values over time. In a second operation 204, the input signal is provided by microcontroller 40 to a MEMS sensor 70 (FIG. 1) as a signal 2. In a third operation 206, a physical displacement is caused in the MEMS sensor 70 responsive to the input signal 2. In a fourth operation 208, an output signal 1 is provided from the MEMS sensor 70 corresponding to the physical displacement in the MEMS sensor 70 responsive to the input signal 2. In a fifth operation 210, the output is monitored external to the MEMS sensor 70 in microcontroller 40. In a sixth operation 212, microcontroller 40 compares the output from MEMS sensor 70 (signals 5 and/or 6) responsive to the input signal 2 with the expected output of MEMS sensor 70 responsive to the input signal 2.

In a seventh operation 214, microcontroller 40 makes a determination, based on the results of the comparison of operation 212, as to whether or not sensor system 30 (FIG. 2) and/or sensor-responsive system 10 (FIG. 1) should be disabled. If sensor system 30 and/or sensor-responsive system 10 are to be disabled, they are disabled in operation 222. If sensor system 30 and/or sensor-responsive system 10 are not to be disabled, processing continues with an eighth operation 216. In eighth operation 216, microcontroller 40 makes a determination, based on the result of the comparison of operation 212, as to whether or not trim values for MEMS sensor 70 need to be adjusted. If new trim values are not needed processing returns to operation 202. If new trim values are needed, processing continues with a ninth operation 218, in which new trim values are calculated using the output signals 5 provided by MEMS sensor 70. In a tenth operation 220, the newly calculated trim values are stored into a measurement block 50 (FIG. 2), and processing then returns to the first operation 202.

In an alternative embodiment (not shown), all of the components generally illustrated in FIG. 2 may be formed together on a single substrate and provided as a unitary device. In yet another alternative embodiment (not shown), all of the components generally illustrated in FIG. 2 may be coupled together in a single module. In yet another alternative embodiment, in addition to providing the ability to disable systems in which MEMS devices cannot be re-calibrated or are no longer functional, the ability to notify users of systems employing MEMS devices of problems with the MEMS devices is provided.

Embodiments described herein provide for the electrical testing of MEMS devices without a need for applying physical forces external to the MEMS device. Systems and methods are provided for testing, monitoring and recalibrating MEMS devices throughout the lifetime of those MEMS devices, even on a continuous basis, while those devices remain located and functioning in systems employing the MEMS devices. Thus, systems and methods achieving design objectives of low-cost MEMS sensor testing, repeated testing of MEMS sensors throughout the life of the MEMS sensors, testing of MEMS sensors without removal of the sensors from the application, and re-calibration of MEMS devices during the life of the MEMS devices are provided. The systems and methods further allow for reduced testing costs, real-time calibration, and improved reliability of the system utilizing the MEMS devices.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A microelectromechanical systems (MEMS) sensor system comprising:
a MEMS sensor configured to provide a first output signal responsive to a physical displacement of a mechanical portion the MEMS sensor;
measurement circuitry electrically coupled to the MEMS sensor and configured to monitor the first output signal and process the first output signal to provide a fourth signal corresponding to the first output signal external to the measurement circuitry;
stimulus circuitry electrically coupled to the MEMS sensor and configured to provide a second stimulus signal to the MEMS sensor responsive to a third signal received by the stimulus circuitry, the second stimulus signal configured to cause a physical displacement of a mechanical portion of the MEMS sensor; and a processor electrically coupled to the measurement circuitry and the stimulus circuitry, wherein the processor is configured to provide the third signal to the stimulus circuitry, the processor configured to receive an indication of physical displacement of the sensor due to the second stimulus signal as indicated by the fourth signal, and wherein the measurement circuitry is further configured to provide a sixth signal to the processor, and further comprises trim circuitry configured to store trim values associated with the MEMS sensor and combine the trim values with the first output signal to provide the sixth signal that is indicative of a physical displacement of the sensor, and wherein the processor is further configured to determine at least one electromechanical property of the MEMS sensor using the indication of physical displacement.

2. A MEMS sensor system as claimed in claim 1 wherein the at least one electromechanical property is at least one of a resonant frequency, damping property, spring constant, thickness, mass, spring stiffness, etching bias thickness, side slope, critical dimension or beam spacing of the MEMS sensor.

3. A MEMS sensor system as claimed in claim 1 wherein the third signal is at least one of a square wave or a multi-tone pattern.

4. A MEMS sensor system as claimed in claim 1, wherein the measurement circuitry further comprises capacitance to voltage conversion circuitry, and wherein the first output signal is a capacitance, the capacitance to voltage conversion circuitry being configured to convert the first output signal to a voltage signal prior to the first output signal being processed to provide the fourth signal.

5. A MEMS sensor system as claimed in claim 4, wherein the measurement circuitry is further configured to provide the voltage signal to the stimulus circuitry.

6. A MEMS sensor system as claimed in claim 1, wherein the stimulus circuitry further comprises digital to analog conversion circuitry, wherein the digital to analog conversion circuitry is configured to receive the third signal from the processor, convert the third signal to an analog signal, and provide the analog signal as the second stimulus signal to the MEMS sensor.

7. A MEMS sensor system as claimed in claim 1, wherein the stimulus circuitry further comprises analog to digital conversion circuitry and a buffer, wherein the analog to digital conversion circuitry is configured to receive the fourth signal, convert the fourth signal to a digital signal, provide the digital signal to a buffer, and provide the digital signal from the buffer to the processor as a fifth signal.

8. A MEMS sensor system as claimed in claim 7 wherein the processor is further configured to perform calculations using the fifth signal to determine at least one electromechanical property of the MEMS sensor.

9. A microelectromechanical systems (MEMS) sensor system comprising:

a MEMS sensor configured to provide a first output signal responsive to a physical displacement of a mechanical portion the MEMS sensor;

measurement circuitry electrically coupled to the MEMS sensor and configured to monitor the first output signal and process the first output signal to provide a fourth signal corresponding to the first output signal external to the measurement circuitry;

stimulus circuitry electrically coupled to the MEMS sensor and configured to provide a second stimulus signal to the MEMS sensor responsive to a third signal received by the stimulus circuitry, the second stimulus signal configured to cause a physical displacement of a mechanical portion of the MEMS sensor; and a processor electrically coupled to the measurement circuitry and the stimulus circuitry, wherein the processor is configured to provide the third signal to the stimulus circuitry, the processor configured to receive an indication of physical displacement of the sensor due to the second stimulus signal as indicated by the fourth signal, and wherein the measurement circuitry is further configured to provide a sixth signal to the processor, and further comprises trim circuitry configured to store trim values associated with the MEMS sensor and combine the trim values with the first output signal to provide the sixth signal that is indicative of a physical displacement of the sensor.

10. A MEMS sensor system as claimed in claim 9, wherein the processor is further configured to process the indication of physical displacement due to the second stimulus signal to determine new trim values and provide the new trim values to the measurement circuitry for storage.

11. A MEMS sensor system as claimed in claim 9, wherein the trim values comprise at least one of an offset of the MEMS sensor and a gain of the MEMS sensor.

12. A MEMS sensor system as claimed in claim 10, wherein the measurement circuitry further comprises filter circuitry configured to filter the first signal to remove noise from the first signal to provide the sixth signal.

13. A sensor-responsive system comprising:

a microelectromechanical systems (MEMS) sensor;

capacitance-to-voltage conversion circuitry coupled to the MEMS sensor and configured to receive a capacitive signal corresponding to a displacement occurring in the MEMS sensor from the MEMS sensor, and convert the capacitive signal into a voltage displacement signal;

analog-to-digital conversion circuitry coupled to the capacitance to voltage conversion circuitry and configured to receive the voltage displacement signal from the capacitance-to-voltage conversion circuitry and convert the voltage displacement signal into a digital displacement signal;

a processor coupled to the analog-to-digital conversion circuitry and configured to receive the digital displacement signal and provide a digital stimulus signal;

digital-to-analog conversion circuitry coupled to the processor and the MEMS sensor, wherein the digital-to-analog conversion circuitry is configured to convert a digital stimulus signal received from the processor into an analog stimulus signal and provide the analog stimulus signal to the MEMS sensor; and, trim circuitry configured to store trim values associated with the MEMS sensor and combine the trim values with the voltage displacement signal or digital displacement signal to provide a trimmed output signal that is indicative of a physical displacement of the MEMs sensor;

wherein the processor is configured to generate a digital stimulus signal, provide the digital stimulus signal to the digital-to-analog converter, monitor the received digital displacement signal resulting from the provided digital stimulus signal, and determine at least one electromechanical property of the MEMS sensor using the received digital displacement signal.

14. A sensor responsive system as claimed in claim 13, wherein the at least one electromechanical property is at least one of a resonant frequency, damping property, spring constant, thickness, mass, spring stiffness, etching bias thickness, side slope, critical dimension or beam spacing of the MEMS sensor.

15. A sensor responsive system as claimed in claim 13, wherein the processor is further configured to calculate a trim value of the MEMS sensor utilizing the digital displacement signal.

16. A sensor responsive system as claimed in claim 15, further comprising memory coupled to the processor, wherein the processor is further configured to store the trim value for the MEMS sensor in the memory.

17. A method of monitoring and calibrating MEMS sensors in a system comprising a MEMS sensor and a processor, comprising:
   generating an electronic input test pattern;
   providing the electronic input test pattern to a MEMS sensor wherein the MEMS sensor includes a portion that displaces responsive to the electronic input test pattern;
   providing an indicator electronic output from the MEMS sensor corresponding to the displacement to the processor;
   combining the indicator electronic output from the MEMS sensor with trim values stored in trim circuitry to provide a trimmed output indicative of a physical displacement of the MEMS sensor;
   comparing, by the processor, the indicator electronic output from the MEMS sensor to an expected output; and,
   determining at least one electromechanical property of the MEMS sensor using the comparison of the indicator electronic output from the MEMS sensor to an expected output.

18. A method as claimed in claim 17, further including the step of disabling the system if the indicator electronic output from the MEMS sensor varies by a pre-determined amount from the expected output.

19. A method as claimed in claim 17, further including the step of calculating, by the processor, a trim value of the MEMS sensor utilizing the indicator electronic output from the MEMS sensor.

20. A method as claimed in claim 19, further including the step of storing, in memory coupled to the processor, the trim value for the MEMS sensor.

* * * * *